United States Patent [19]
Martin

[11] Patent Number: 6,107,814
[45] Date of Patent: Aug. 22, 2000

[54] METHODS AND CIRCUITS FOR TESTING OPEN COLLECTORS AND OPEN DRAINS

[76] Inventor: William C. Martin, 3838 Westminister Dr., Carrollton, Tex. 75007

[21] Appl. No.: 08/530,936

[22] Filed: Sep. 20, 1995

Related U.S. Application Data

[62] Division of application No. 08/334,114, Nov. 4, 1994, Pat. No. 5,471,153.

[51] Int. Cl.⁷ ..................................................... G01R 31/28
[52] U.S. Cl. ........................ 324/763; 324/158.1; 324/765; 714/733
[58] Field of Search ..................................... 324/765, 763; 371/22.31, 22.33, 25.1; 714/726, 728, 736

[56] References Cited

U.S. PATENT DOCUMENTS

| | | | |
|---|---|---|---|
| 4,357,703 | 11/1982 | Van Brunt | 371/22.5 |
| 5,254,940 | 10/1993 | Oke et al. | 371/22.5 |
| 5,331,643 | 7/1994 | Smith | 371/22.33 |

*Primary Examiner*—Ernest Karlsen
*Attorney, Agent, or Firm*—Burns Doane Swecker & Mathis L.L.P.

[57] ABSTRACT

The present invention is directed to methods and circuits for testing open collector or open drain output pads. In a preferred embodiment, the open collector or open drain outputs are hard driven to both their normal low and high level logic states during a test mode of operation. By actively driving open collector or open drain output pads to both their active and their inactive states, the existence of a stable output at any given sample time is guaranteed during a functionality test. The need to accurately estimate time delays associated with RC loads of external circuitry and the need to precisely strobe an open collector or open drain output following transition to an inactive, disabled state are therefore eliminated. Further, control signal inputs associated with a high impedance condition of open collector or open drain output pads can be directly examined at the circuit output using appropriate test logic.

8 Claims, 2 Drawing Sheets

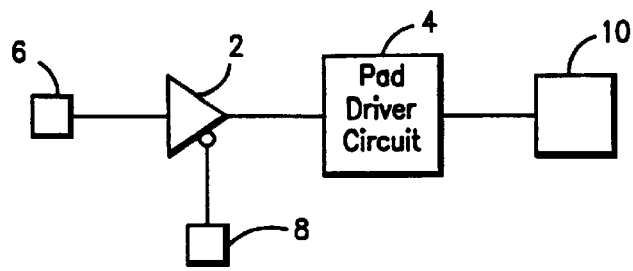
FIG._1
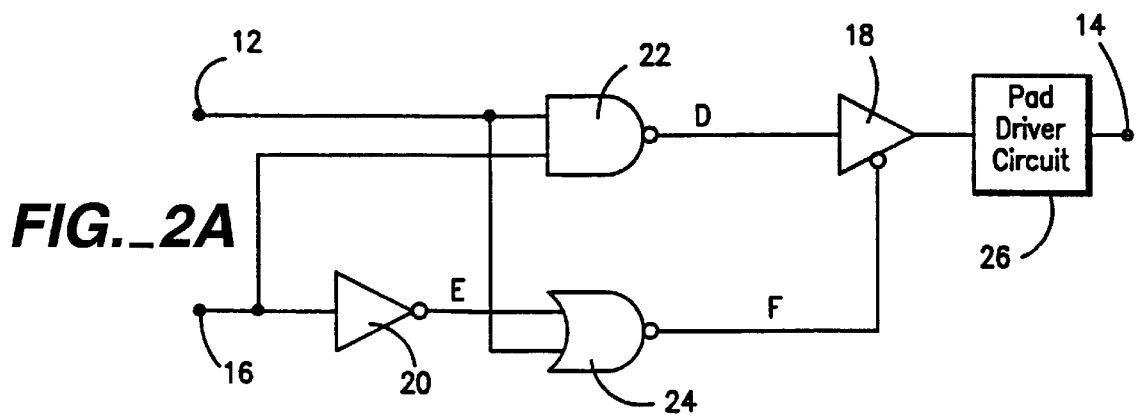
FIG._2A
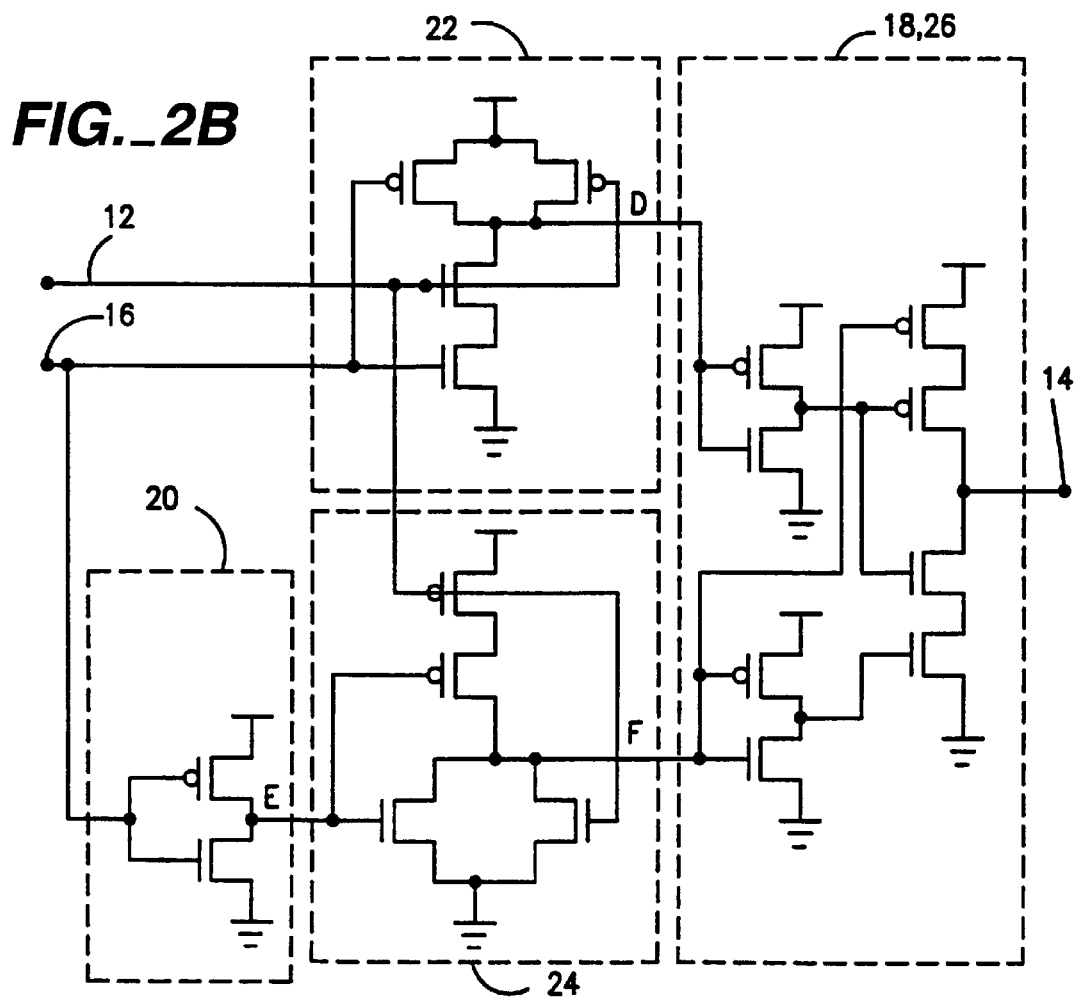
FIG._2B

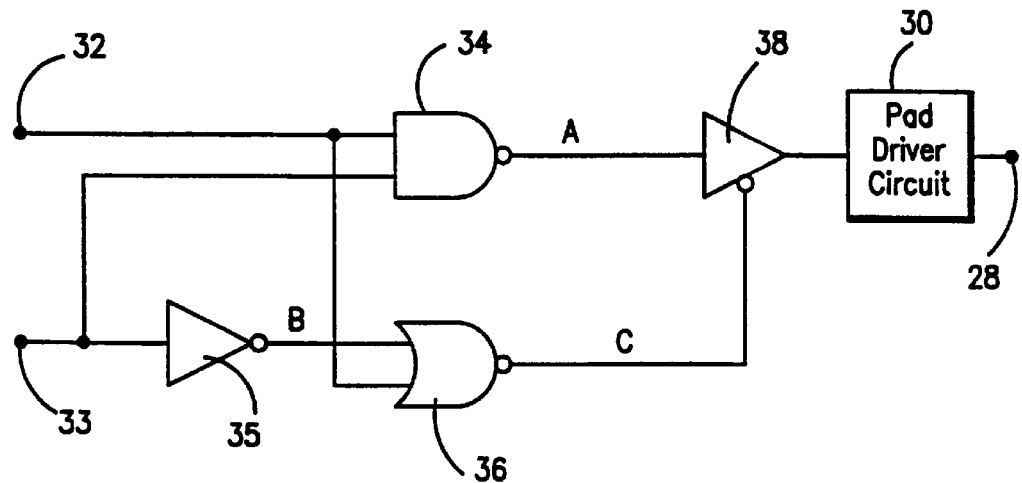
FIG._3A
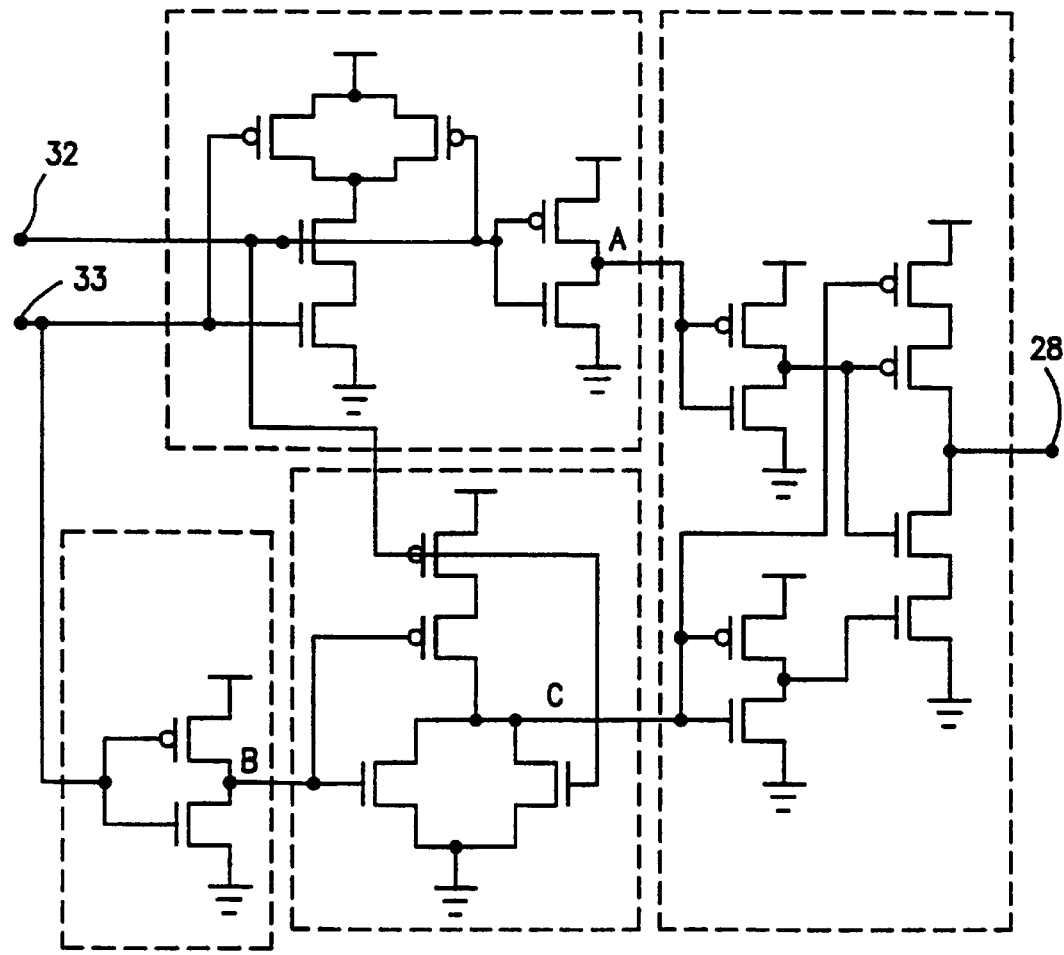
FIG._3B

METHODS AND CIRCUITS FOR TESTING OPEN COLLECTORS AND OPEN DRAINS

This application is a divisional, of Application Ser. No. 08/334,114, filed Nov. 4, 1994, now U.S. Pat. No. 5,471,153.

BACKGROUND OF THE INVENTION

1. Field of the Invention

The present invention generally relates to the design and testing of circuits, such as integrated circuits and more particularly relates to methods and devices for accurately testing circuits having open drain or open collector outputs during the design and manufacture of these circuits.

2. State of the Art

Testings devices, or testers, are currently used for establishing a test set up to check the functionality of circuits, such as integrated circuits. Integrated circuits, including application specific integrated circuits (ASICs), normally have one or more functional blocks or megafunctions, each of which is composed of any number of logic gates. Further, a circuit designer will typically include integrated circuit output pads for generating open collector or open drain outputs. Output pads are physical outputs of an integrated circuit for connecting with other external devices.

For example, an open drain output pad can provide a logic level high output state and a high impedance output state. When in its high impedance state, the logic high output state is typically pulled down to a logic level low by an external circuit which, for example, includes a pull-down resistor. This output state is controlled in response to internal conditions of a pad driver circuit in conjunction with the condition of the external circuit connected to the pad output. Subsequently, internal conditions of the circuit can be modified to once again drive the output to its logic level high state as will be described below.

Similarly, an open collector output pad can provide a logic level low output and a high impedance state. During the high impedance state, the pad output is pulled up to a logic level high. Afterwards, internal conditions of the circuit can be modified to again drive the output to a logic level low.

The internal inputs to an integrated circuit output pad typically include an output enable control signal and an input drive signal. The output enable control signal determines the output condition of the pad. For example, when an active low output enable control signal is high (i.e., inactive condition), the output pad is placed into its high impedance state. On the contrary, when the active low output enable control signal is low (i.e., active condition), the output pad is actively driven to the logic state dictated by the input drive signal.

Thus, open collector and open drain output pads are valuable to the circuit designer because their output can be driven to a known logic state and, afterwards transitioned to another logic state. These output pads are often included on semiconductor chips for initiating an interrupt condition. The output pads of different devices can be connected via a wired "AND" so that plural interrupts can be generated over a single interrupt line.

For example, to initiate an interrupt with an open collector, the open collector output is driven from a pulled-up high impedance state to a low logic level. After the interrupt has been serviced, the enable control signal of the open collector is deactivated such that external circuitry can again pull-up the open collector pad output and return it to a logic level high. A pull-up device associated with the external circuitry causes the open collector pad output to rise, or "float" to the inactive logic level high condition at a rate proportional to an RC time constant associated with the pull-up device.

More particularly, an external resistor (i.e., either pull-up or pull-down) is typically associated with a given output pad. The same external pull-up or pull-down circuitry can be associated with plural output pads combined to form a net of potential interrupting devices. When a pad is placed into its high impedance state, the resistance value and attendant capacitance of circuits connected to that pad constitute an RC time constant. The high impedance state (or tri-state) is thus characterized by resistance and capacitance which affects a transition of the pad output to the logic level associated with the high impedance state.

To ensure that a circuit having open collector and/or open drain output pads will operate properly, it is desirable to use a test set up which can simulate circuits to be connected to the output pads. Functionality testing of a circuit is necessary to identify flaws due, for example, to incorrect logic designs in the circuit, timing problems and manufacturing defects. However, the testing of circuits which include open collector and open drain output pads poses several difficulties which often result in inaccurate testing.

During integrated circuit testing, a typical testing device will simulate the output impedance associated with open collector or open drain output pads. However, timing considerations related to the RC constant of the test environment (e.g, the testing device) will affect both the performance of the output pad as well as the proper point in time to test for a valid output during an inactive output enable control signal. For example, the pad output can be instantaneously driven to an active state in response to an output enable control signal, the float time required for is the output to achieve its inactive, high impedance state is dependent upon the RC conditions of the test environment.

Because the RC time constant will vary from test set up to test set up, a test time at which the output pad is examined to determine whether its output has properly transitioned during an inactive output state will be different for different testers. Further, the numerous potential output drive/output capacitive loading combinations which exist render the use of software-based testing techniques infeasible.

Accordingly, it would be desirable to provide accurate techniques and devices for testing circuits designed with open collector and/or open drain outputs.

SUMMARY OF THE INVENTION

The present invention is directed to methods and circuits for testing open collector or open drain output pads. In a preferred embodiment, the open collector or open drain outputs are hard driven to both their normal low and high level logic states during a test mode of operation.

By actively driving open collector or open drain output pads to both their active and their inactive states, the existence of a stable output at any given sample time is guaranteed during a functionality test. The need to accurately estimate time delays associated with RC loads of external circuitry and the need to precisely strobe an open collector or open drain output following transition to an inactive, disabled state are therefore eliminated. Further, control signal inputs associated with a high impedance condition of open collector or open drain output pads can be directly examined at the circuit output using appropriate test logic.

BRIEF DESCRIPTION OF THE DRAWINGS

The present invention can be further understood by reference to the following description and the appended drawings which illustrate the invention. For purposes of description, identical components are given the same reference numerals in the various drawing figures. In the drawings:

FIG. 1 shows a typical output pad;

FIGS. 2a and 2b show exemplary embodiments of gate level and transistor level implementations, respectively of an open drain control circuit according to the present invention; and, FIGS. 3a and 3b show exemplary embodiments of gate level and transistor level implementations of an open collector control circuit according to the present invention.

DETAILED DESCRIPTION OF THE PREFERRED EMBODIMENTS

FIG. 1 shows a typical output pad which includes an input logic block 2 that contains pad driver circuitry 4 for driving a metal pad. Inputs to the logic block include a normal input 6, and an output enable control signal 8. In a conventional, active low open collector output, the normal input 6 is connected to a logic low level (e.g., ground). In a conventional active low open drain output, the normal input 6 is connected to a logic high level (i.e., $V_{DD}$). An output signal which is generated in response to the input signals 6 and 8 appears at the pad 10 which is, for example, formed as a semiconductor chip output pin.

A truth table associated with the FIG. 1 circuit when the pad driver circuitry 4 represents an open drain configuration with an active low output enable is as follows:

| Inputs | | Pad |
|---|---|---|
| OEN | I | PAD OUT |
| H | X | Z |
| L | H | H |
| L | L | L |

In the foregoing truth table, OEN represents a logic state of the output enable control signal 8, I represents a logic state of the input 6 (X representing that the logic level is irrelevant) and PAD OUT represents, a logic state of the output 10 (Z representing a high impedance condition).

A truth table associated with the FIG. 1 circuit when the pad driver circuitry 4 represents an open collector configuration with an active low output enable control signal is as follows:

| Inputs | | Pad |
|---|---|---|
| OEN | I | PAD OUT |
| H | X | Z |
| L | L | L |

As can be seen in FIG. 1, two potential outputs exist at the pad output 10 for given combinations of signals at inputs 6 and 8 during normal operation. More particularly, provided the output enable control signal is low, the pad output 10 will be driven to the input 6 (i.e., either a low or a high signal is present at both input 6 and output 10). When the output enable control signal is low, the FIG. 1 circuit is therefore considered to be in its "ON", or active condition. This condition can, for example, be used to initiate an interrupt on an interrupt line having a given logic state.

However, when the output enable control signal 8 is high, the pad output 10 is placed into an "OFF", or inactive state. This functional state of the FIG. 1 circuit is typically referred to as a tri-state control condition, and is characterized as a high impedance state, regardless of the signal state present at the input 6.

As described previously, it is often desirable to test the functionality of a circuit including open drain or open collector outputs prior to implementation of the circuit on, for example, an integrated circuit. For this purpose, a test mode of circuit operation is typically initiated by providing a test input to logic in the circuit design.

FIGS. 2(a) and (b) show an exemplary implementation of an open drain output pad control circuit designed for functionality testing in accordance with a preferred embodiment of the invention. The FIG. 2(a) circuit causes a signal present at a control pin input 12, or test input, to appear at an output pad 14 during proper test mode operation. As shown in FIG. 2(a), the test input 12 can be used to effect a test mode of operation and to provide the input signal for the output pad control circuit.

The test input 12 is connected to a first input of a NAND gate 22 and to a first input of a NOR gate 24. An output enable control signal 16 is also provided, and is connected to second inputs of the NAND gate 22 and the NOR gate 24, respectively. The output enable control signal 16 is connected to the NOR gate 24 via an invertor 20. An output of NAND gate 22 is used as the input signal for a logic block of the output pad control circuit. An output of the NOR gate 24 is provided as the output enable input for the logic block 18.

The output of logic block 18 is connected to a pad driver circuit 26 which produces an output on the open drain pad 14. When enabled, the input logic block 18 provides the output signal from the NAND gate 22 to the output pad 14. During operation, the FIG. 2(a) circuit can be placed into the test mode during circuit simulation and/or testing to verify correct operation. Activation of the test mode is initiated via the input of an appropriate logic level signal on the test input 12. During the test mode, both open drain active and inactive conditions of output pad 14 can be verified. In the exemplary embodiment shown in FIG. 2(a), NAND gate 22 responds to an active high signal at test input 12 for testing the active and inactive conditions of output pad 14.

On the contrary, a logic level low test input places the FIG. 2(a) circuit into a normal mode of operation. During normal operation, the output pad 14 can be placed into either a high impedance state (i.e., output enable control signal is inactive high) or driven to a logic level high (i.e., output enable control signal is active low). By driving the output to a logic level high, an interrupt can be generated on a normally, low interrupt line.

Use of the test input 12 in conjunction with a circuit such as that of FIG. 2(a) permits the output pad to be hard driven to both its inactive and active states. Further, the logic used to test the circuit can be selected so that the logic condition of the output pad 14 during a test mode corresponds to an output condition which should be present at the output pad 14 during normal operation. In an alternate embodiment, the logic condition of the output obtained during a test mode can be made to correspond to the logic state of the output enable control signal 16. For example, in the FIG. 2(a) circuit, the NAND gate 22 can be replaced with an OR gate coupled to the test input 12 via an invertor to achieve such a relationship between the pad output and the output enable control signal.

Thus, circuitry need not be provided to simulate RC delays associated with external circuits connected to the output pad during normal operation. This permits both conditions of the output pad to be accurately and reliably tested. Further, should it be desired to perform "at speed" testing, it is not necessary to accurately strobe the output pad to account for floating time from an active to an inactive state. As referenced herein, "at speed" testing refers to the testing of a circuit at the desired speed of normal circuit operation in a non-test mode; e.g., generally faster than 1 MHZ.

FIG. 3(a) shows an exemplary embodiment of an open collector output pad 28 driven by pad driver circuit 30. In the FIG. 3(a) embodiment, a test input 32 is connected to first inputs of an AND gate 34 and a NOR gate 36, respectively. Second inputs of the AND gate 34 and the NOR gate 36 are connected to an output enable control signal, with the NOR gate 36 receiving the output enable control signal via an input 33 and an invertor 35. An output of the AND gate 34 represents the input signal to a logic block 38 which is enabled by an output enable control signal from the NOR gate 36. An output of the logic block 38 is connected to the pad driver circuit 30.

In the exemplary embodiment of FIG. 3(a), the open collector output pad 28 follows the logic level of the output enable control signal 33. As with the FIG. 2(a) circuit, the test input of the FIG. 3(a) circuit output is active high, such that a high level logic test input will place the circuit into a test mode of operation. During the test mode, the output 28 can be hard driven to conditions associated with both active and inactive conditions of the output enable control signal 33. On the other hand, a low logic level test input permits normal circuit operation.

During normal operation, the output pad will typically be hard driven to its active condition, but would be permitted to float from the active to the inactive condition in accordance with an RC delay of external circuitry connected thereto. Thus, the FIG. 3(a) open collector test circuitry affords advantages similar to those described above with respect to the FIG. 2(a) open drain test circuitry.

FIG. 2(b) shows an exemplary transistor level implementation of the FIG. 2(a) open drain gate level implementation. Nodes represented as D, E and F in FIG. 2(a) are similarly represented in FIG. 2(b).

As described previously, the FIG. 2(b) circuitry will operate to place the same logic level at the output pad 14 during both a normal mode and a test mode of operation. The exemplary FIG. 2(b) transistor level implementation is shown to include p and n transistors. Other implementations of the FIG. 2(b) test logic will be readily apparent to those skilled in the art. For example, the FIG. 2(b) circuit can be configured using any arrangement of logic devices which will provide the logic level outputs described above.

In operation, a test mode is initiated by placing a high signal on the test input 12. On the other hand, normal operation of the circuit is performed by keeping the test input low. A truth table which illustrates the function of the FIG. 2(b) circuit for both normal operation and for the test mode of operation is as follows:

TABLE 1

| Test | Tri | E | D | F | Open_drain pad | Function |
|------|-----|---|---|---|----------------|----------|
| 0 | 0 | 1 | 1 | 0 | high | normal op |
| 0 | 1 | 0 | 1 | 1 | hi-z impedance | normal op |
| 1 | 0 | 1 | 1 | 0 | high | test mode |
| 1 | 1 | 0 | 0 | 0 | low | test mode |

In Table 1, the entries E, D and F correspond to the similarly labelled nodes in FIGS. 2(a) and 2(b). As can be seen from Table 1, during normal operation (e.g., test input low), the open drain output 14 is in an inactive high impedance condition when the output enable control signal 16 (labelled "Tri" in the table) is high. Because the FIG. 2(b) circuit is designed to provide an active low output enable control signal, this high signal represents an inactive, or "OFF" condition of the open drain output. Alternatively, if the output enable control signal 16 is low, the output 14 is driven to an "ON", or active high condition.

During a test mode of operation, the test input 12 is active high. Both the inactive and the active conditions can now be tested during a circuit simulation and/or testing by transitioning the output enable control signal 16 between high and low states. Because the output 14 is hard driven to both inactive and active conditions during the test mode, no external pull-up/down resistors will influence the output. Accordingly, there is no need to simulate a pull-up or pull-down RC time constant at the output 14, nor is there any need to accurately time an output sampling strobe with the RC delay. Further, because the open drain output will emulate the normal operation output for a given output enable control signal condition, the output enable control signal can also be verified during the test mode of operation.

For example, assuming proper operation of the FIG. 2(b) circuit, the open drain output is high when the output enable control signal is low during both normal and test operation. Thus, input signals used for the normal mode of operation can serve as test vectors during the test mode of operation. Test vectors, as referenced herein, are test signals input to a circuit for determining whether predetermined outputs are obtained in response thereto.

FIG. 3(b) represents an exemplary transistor level implementation of the FIG. 3(a) open collector gate implementation. Nodes labelled A, B and C in FIG. 3(a) are similarly labelled in FIG. 3(b). A truth table which illustrates the function of the FIGS. 3(a) and 3(b) circuit for both normal and test operation is as follows:

TABLE 2

| Test | Tri | B | A | C | Open_collector pad | Function |
|------|-----|---|---|---|--------------------|----------|
| 0 | 0 | 1 | 0 | 0 | low | normal op |
| 0 | 1 | 0 | 0 | 1 | hi-z impedance | normal op |
| 1 | 0 | 1 | 0 | 0 | low | test mode |
| 1 | 1 | 0 | 1 | 0 | high | test mode |

As shown in TABLE 2, a test mode is initiated when input 32 goes high. During normal operation, the open collector output is low when the output enable control signal 33 is low. This output condition represents an active, or "ON" condition of the open collector circuit wherein external circuitry connected thereto is driven. However, when the output enable control signal 33 is high during normal operation, the output 28 is placed into an inactive high impedance, or "OFF" condition.

During a test mode of operation, the open collector output will emulate normal operation outputs for given logic levels of the output enable control signal. As shown in TABLE 2, when the test input 32 is high and the output enable control signal 33 is low, the open collector output pad is driven to an active low condition, assuming proper circuit operation. However, if the output enable control signal 33 is high during the test mode, then the open collector output is driven to an inactive high condition which represents the high impedance condition during normal operation.

Thus, as with the FIG. 2(b) circuit, a user can directly test the output enable control signal 33 of the FIG. 3(b) circuit. Further, input vectors associated with normal circuit operation can be used as test vectors during a test mode of operation, and accurate testing can be performed by strobing the output at a normal operating speed (e.g., 50 ns).

The foregoing has described the principles, preferred embodiments and modes of operation of the present invention. However, the present invention should not be construed as being limited to the particular embodiments discussed. Accordingly, the above-described embodiments should be regarded only as illustrative, and it should be appreciated that workers skilled in the art may make variations in those embodiments without departing from the spirit and scope of the invention as defined by the following claims.

What is claimed is:

1. A circuit having at least two output conditions during operation in a non-test mode, one of said output conditions being a relatively high impedance condition and another of the output conditions being a first voltage level, comprising:

means for placing said circuit into a test mode of operation;

means for receiving an enable signal and for driving an output of said circuit during the test mode to each of a second voltage level that represents the relatively high impedance output condition and the first voltage level, in response to said enable signal, the first and second voltage levels corresponding to predetermined logic levels of said enable signal during proper circuit operation.

2. A circuit according to claim 1, wherein said circuit is at least one of an open drain circuit and an open collector circuit.

3. A circuit according to claim 1, wherein said circuit is an open drain circuit.

4. A circuit according to claim 1, wherein said circuit is an open collector circuit.

5. Circuit according to claim 3, wherein said means for driving includes a NOR gate.

6. Circuit according to claim 3, wherein said means for driving includes a NAND gate.

7. Circuit according to claim 4, wherein said means for driving includes a NOR gate.

8. Circuit according to claim 4, wherein said means for driving includes a NAND gate. circuit.

* * * * *